(12) United States Patent  
Hein et al.

(10) Patent No.: US 7,136,051 B2  
(45) Date of Patent: Nov. 14, 2006

(54) TOUCH PAD SENSOR FOR MOTOR VEHICLE

(75) Inventors: David A. Hein, Sterling Heights, MI (US); Larry I. Shelton, Brighton, MI (US)

(73) Assignee: Lear Corporation, Southfield, MI (US)

( * ) Notice: Subject to any disclaimer, the term of this patent is extended or adjusted under 35 U.S.C. 154(b) by 480 days.

(21) Appl. No.: 10/812,223

(22) Filed: Mar. 29, 2004

(65) Prior Publication Data

US 2005/0134559 A1   Jun. 23, 2005

Related U.S. Application Data

(63) Continuation-in-part of application No. 10/744,168, filed on Dec. 22, 2003.

(51) Int. Cl.
*G09G 5/00* (2006.01)

(52) U.S. Cl. ...................... 345/173; 345/156

(58) Field of Classification Search ................ 345/173, 345/174, 156
See application file for complete search history.

(56) References Cited

U.S. PATENT DOCUMENTS

| | | |
|---|---|---|
| 5,594,222 A | 1/1997 | Caldwell |
| 6,310,611 B1 | 10/2001 | Caldwell |
| 6,320,282 B1 | 11/2001 | Caldwell |
| 2002/0057020 A1 | 5/2002 | Caldwell |
| 2003/0121767 A1 | 7/2003 | Caldwell |

*Primary Examiner*—Ricardo Osorio
(74) *Attorney, Agent, or Firm*—McMillian, Sobanski & Todd, LLC

(57) ABSTRACT

A control panel of other electronic interface comprises an interior trim component having a touch pad and a target area associated with the touch pad. A non-movable switch is located behind the target area. The switch is operable to actuate and de-actuate an electrically operated device of the motor vehicle. The target area is associated with a sensitive operating portion or region of the switch.

8 Claims, 5 Drawing Sheets

TOUCH PAD SENSOR FOR MOTOR VEHICLE

CROSS REFERENCE TO RELATED APPLICATIONS

This application is a continuation-in-part of co-pending U.S. application Ser. No. 10/744,168, filed Dec. 22, 2003, entitled "Touch Pad For Motor Vehicle And Sensor Therewith."

STATEMENT REGARDING FEDERALLY SPONSORED RESEARCH

Not Applicable.

BACKGROUND OF THE INVENTION

This invention relates in general to motor vehicles and more particularly to an interface for controlling operations of a motor vehicle. Most particularly, the invention relates to a touch pad for motor vehicles.

A conventional interface for a motor vehicle typically includes a switch or a switch array, which generally comprises a large number of switches, that is mounted in and around the armrests, console, and/or dashboard of the motor vehicle. By convention, motor vehicles employ mechanical switches, which have physically moving (e.g., sliding) parts that create contact between conductors. Openings are provided in the interior trim components of the motor vehicle for receiving the switches. The openings commonly attract dust and dirt. This dust and dirt is difficult to reach. Consequently, the interior trim component is difficult to clean.

The physical characteristics of the switches usually occupy space (i.e., usually about 0.5 to 5 mm) for the mechanical movement of the switches. This limits the ability to style and craft the interior trim component. The switches are also subject to wear and mechanical breakdown due to the moving parts of the switches and thus may become unreliable.

The requirement for the switch openings in the interior trim components requires increased cut lines during the production of the interior trim components and the unique character of each of the switches requires an increased parts count.

What is needed is a highly-reliable interface with non-movable switches that is easy to use and that increases the ability to style and craft an attractive, easy-to-clean, environmentally protected interior component while reducing cut lines and total parts count.

SUMMARY OF THE INVENTION

The present invention is directed towards an interface that meets the foregoing needs. The interface comprises an interior trim component having a touch pad and a target area associated with the touch pad. A non-movable switch is located behind the target area. The switch is operable to actuate and de-actuate an electrically operated device of the motor vehicle. The target area is associated with a sensitive operating portion or region of the switch.

Various objects and advantages of this invention will become apparent to those skilled in the art from the following detailed description of the preferred embodiment, when read in light of the accompanying drawings.

DETAILED DESCRIPTION OF PREFERRED EMBODIMENTS

Figure 1:
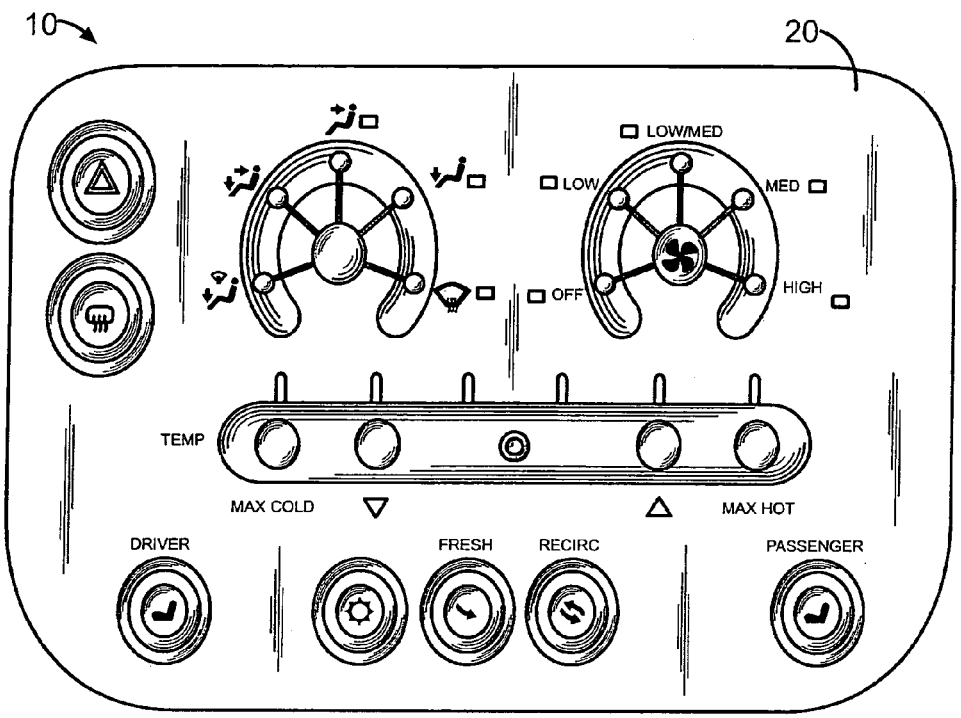
FIG. 1 is a front elevational view of a motor vehicle interior trim component according to a preferred embodiment of the invention.

Referring now to the drawings, there is illustrated in FIG. 1 an interface for a motor vehicle including a motor vehicle interior trim component, generally indicate at 10. The interior trim component 10 supports a switch or a switch array, which is a large number of switches, that is operable to actuate and de-actuate one or more electrically operated devices (not shown) of the motor vehicle, such as the driver's and passenger's heated seats, hazard flashers, rear defogger, and climate control system of the motor vehicle.

The interior trim component 10 is preferably made of a material, such as a plastic-based material, that is molded or otherwise crafted as desired to produce a substantially rigid structure having a desired style. The molding of interior trim components is well known to those of ordinary skill in the art of the invention and thus will not be described in further detail.

The interior trim component 10 is preferably molded in a single piece, having unitary construction, and preferably having no openings, at least where switches are located, for collecting dust and dirt and thus is relatively easy to wash or otherwise keep clean.

The interior trim component 10 may be substantially flat or non-ornamental in style or have tactile features such as, for example, deformations, such as raised areas, depressed areas, or both raised and depressed areas, to permit a user to easily locate the switches.

Figure 2:
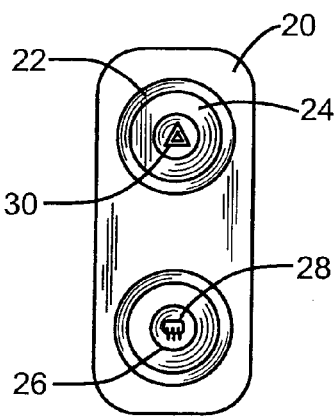
FIG. 2 is an enlarged front elevational view of a portion of the interior trim component shown in FIG. 1 showing hazard flasher and rear defogger switches.

The interior trim component 10 according to the present invention may comprise a trim bezel, face plate or fascia 20, which preferably has a tactile identifier 22, such as the trough or mote shown in FIG. 2, to provide an appearance of a switch, such as the rear defogger and hazard flasher switches shown, and visually identify or define the location of such switches. Other switches, such as the driver's and the passenger's heated seats and the climate control switches, may be formed in a similar manner. A tactile guide 24 may be provided within and concentric to the tactile identifier 22. The tactile guide 24 is preferably in the form of a crown, in contrast to the trough or mote described above. The profile of the tactile guide 24 preferably does not exceed the profile of the fascia 20. A target or target area 26 is located within the tactile guide 24 and is preferably in the form of a dimple, cavity or like depression, in contrast to the crown which forms the tactile guide 24. The dissimilar topographies allow the user to visually identify the location of the switch and a sensitive operating portion or region (i.e., the target area 26) of the switch for actuating and de-actuating different electrically operated devices (not shown) when the switch is operated by a user. In accordance with a preferred embodiment of the invention the interior trim component 10, or at least portions thereof where switches are located, may be transparent or translucent and back-lit, as will be described in greater detail hereinbelow, to enable the user to visually identify the location of the switches when operating the motor vehicle in the dark. Moreover, the switches may carry indicia 28, 30, such as the standard rear defogger and hazard flasher switch identification symbols shown, to allow the user to easily associate the switches with the devices the switches operate.

Figure 3:
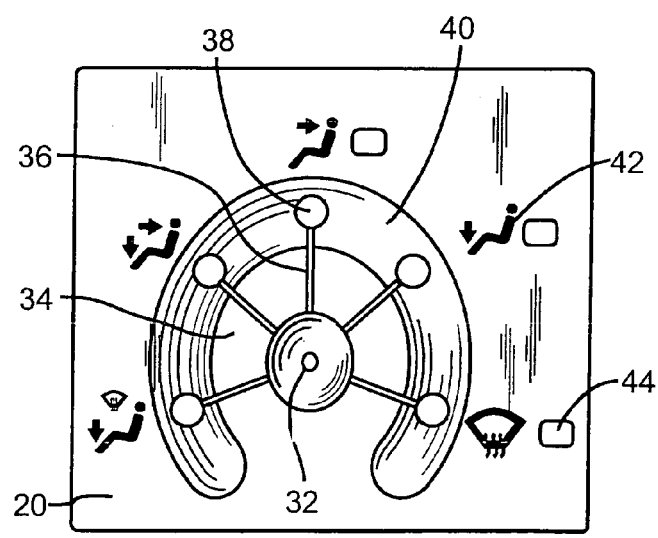
FIG. 3 is an enlarged front elevational view of a portion of the interior trim component shown in FIG. 1 showing a vent switch array of the motor vehicle climate control.

The fascia 20 may further be provided with a tactile identifier 32 in the form of a protruding member, similar in shape to an adjustment knob, for identifying a home position or starting point for a switch array, such as the vent switch array shown in FIG. 3, for controlling the function or operation of an electrically operated device, such as the vents of the motor vehicle climate control system. A tactile guide 34, such as the crown shown, may be formed about the tactile identifier 32 to guide the user to the tactile identifier 32. The profile of the tactile guide 34 preferably does not exceed the profile of the fascia 20. Extending from the tactile identifier 32 are spokes or veins 36 that may function to guide the user to various targets or target areas 38. In the illustrated embodiment, the target areas 38 are dimples that function to provide a tactile sensation when encountered by the user. The target areas 38 may be located within an auxiliary tactile guide 40, which may be provided about and concentric to the tactile identifier 32 and the tactile guide 34. The target areas 38 identify the sensitive operation portion or region of the switches in the switch array that actuate and de-actuate the electrically operated device when the switch is operated by the user. The interior trim component 10, or at least portions thereof where switches are located, may be transparent or translucent and back-lit to enable the user to visually identify the location of switches when the motor vehicle is operated in the dark. Moreover, the interior trim component 10 may carry indicia 42, such as the standard vent identification symbols shown, to allow the user to easily associate the switches with the devices the switches operate. Furthermore, the interior trim component 10 may have areas 44 associated with each target area 38 that are transparent or that otherwise permit indicators 40, such as light emitting diodes (LED) (not shown), to be viewed when the switches associated with corresponding areas 44 are operated. Other switch arrays, such as the fan motor speed control switch array shown in FIG. 1, may be formed in a similar manner to the vent control switch array described above.

Figure 4:
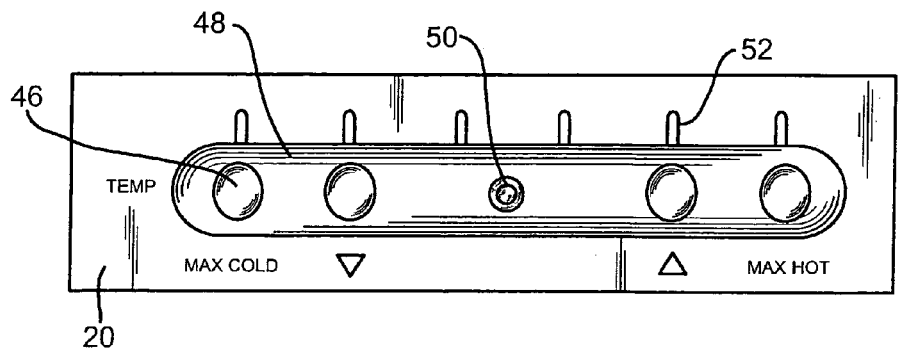
FIG. 4 is an enlarged front elevational view of a portion of the interior trim component shown in FIG. 1 showing a temperature control switch array of the motor vehicle climate control.

Another example of a switch array is illustrated in FIG. 4. This switch array is suitable for use as the temperature control switch array of the motor vehicle climate control system. In accordance with a preferred embodiment of the invention, the fascia 20 may have therein a tactile identifier 46, such as the relief shown. A plurality of targets or target areas 48, such as the dimples, cavities or like depressions shown, may be located within the tactile identifier 46. A tactile guide 50, such as the raised button shown, may be located within the tactile identifier 44, preferably in the axial center of the tactile identifier 46 and equidistantly between opposing target areas 48 to function as a home position for the switch array. The illustrated switch array may have switches associated with outer axial target areas 48 that cause the operating temperature of the motor vehicle climate control system to operate at maximum cold and hot temperatures. Switches associated with inner axial target areas 48, when stimulated, cause incremental changes in the operating temperature of the motor vehicle climate control system. The switch array may have areas 52 that are transparent or that otherwise permit an indicator, such as an LED (not shown), to be viewed when certain conditions are met. For example, the areas 52 may be color-coded. In accordance with known standards, areas 52 associated with cooler thermostatic temperatures may be blue while areas 52 associated with warmer thermostatic temperatures may be red.

Figure 5:
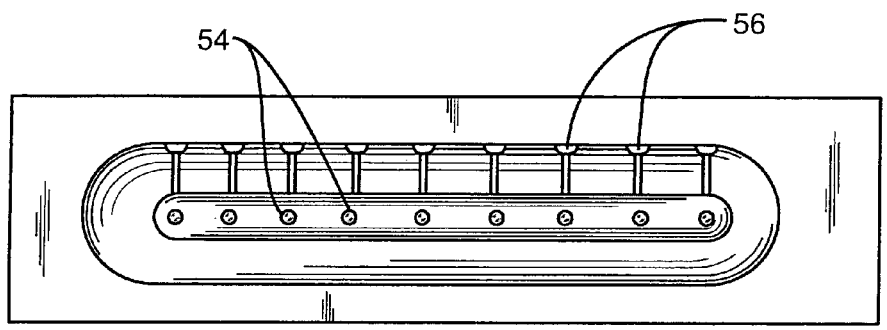
FIG. 5 is a partially cutaway front elevational view of alternative temperature control switch array.

Another example of a switch array is illustrated in a partially cutaway view in FIG. 5. This switch array is suitable for use as the temperature control switch array of the motor vehicle climate control system as well. In accordance with this embodiment of the invention, a plurality of target areas 54 may be provided for more discrete control of the climate control system. Each target area 54 has associated therewith a switch and an associated visual indicator 56, such as an LED (not shown), which provides a visual indication when the switch associated therewith is operated. The indicators 56 associated with the switch causing the climate control system to operate at cooler temperatures may be blue and the indicators 56 associated with the switch causing the climate control system to operate at warmer temperatures may be red.

Figure 6:
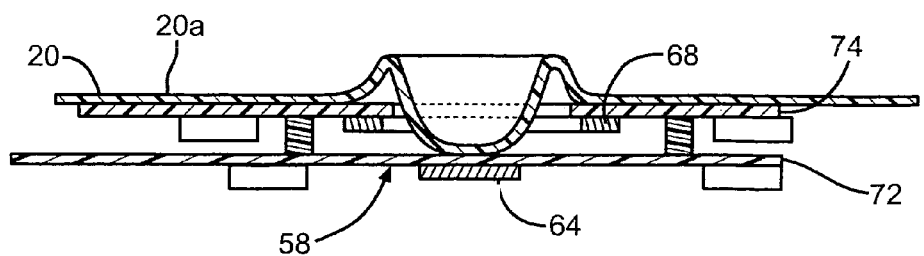
FIG. 6 is a cross-sectional view in plan of a non-movable switch that is adapted for use with the motor vehicle interior trim component.

In accordance with the present invention, the switches are non-mechanical or non-movable touch cells or switches, such as, but not limited to, resistive, inductive, piezoelectric and capacitive switches. A capacitive switch that is suitable for carrying out the invention is shown at 58 in FIG. 6. The switch 58 may be of the type described, for example, in U.S. Patent Application Publication No. 2002/0057020, published May 16, 2002, the description of which is incorporated herein by reference. The fascia 20 may be in the form of a substantially rigid substrate having a front surface 20*a*, which may form a part of the interior trim component 10 of the motor vehicle and may be decorated and contoured for switches. The switch 58 may include one or more independent dielectric substances (e.g., printed circuit boards), which may support one or more electrodes and one or more electrical components (i.e., one or more R-C filters or networks and integrated circuits). In the illustrated embodiment, a first one of the printed circuit boards supports at least a first electrode 64. A second one of the printed circuit boards supports at least a second electrode 68. One or more electrical components may be supported by either dielectric substance, or by a separate component. The first and second electrodes 64, 68 are associated with a touch sensor. The touch sensor is cooperatively formed by the dielectric substances, the electrodes, and the electrical components. The electrodes 64, 68 are preferably separated to provide three-dimensional separation therebetween. In the illustrated embodiment, the first and second dielectric substances are defined by first and second printed circuit boards 72, 74. The second printed circuit board 74 has an opening through which a portion (i.e., the target area 26) of the fascia 20 passes. The second electrode 68 is supported by the second printed circuit board 74 about the opening. The first electrode 64 is supported by the first printed circuit board 72, coincident with the opening in the second circuit printed board 74, and opposite the target area 26. The first and second printed circuit boards 72, 74 are spaced apart to provide the preferred three-dimensional separation between the electrodes 64, 68. Due to the three-dimensional separation of the electrodes 64, 68, the second electrode 68 forms a background capacitive sensor for detecting ambient conditions and, to a lesser extent, external disturbances while the first electrode 64 forms a capacitive sensor that detects both detecting ambient conditions and external disturbances but has a greater coupling to the external disturbances. This construction provides an accurate detection of external disturbances when a stimulus (i.e., a touch input) is placed between the first and second electrodes 64, 68 and, more so, in greater proximity to the first electrode 64.

Figure 7:
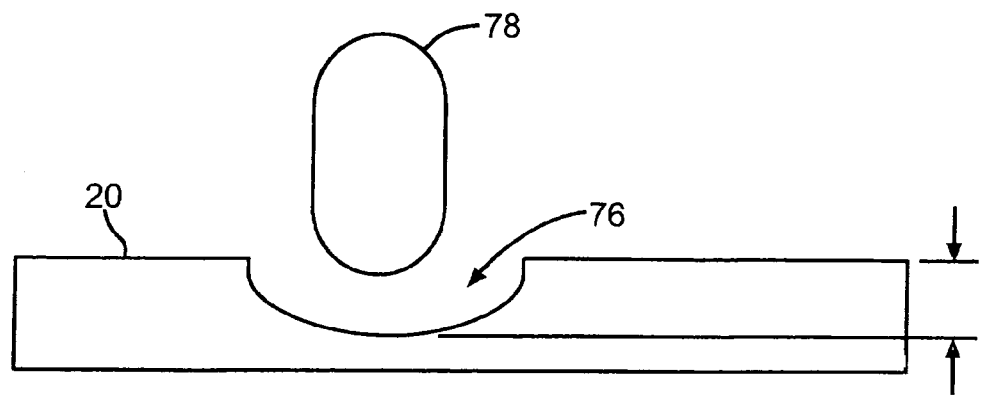
FIG. 7 is a diagrammatic representation of a sensing zone for the switch shown in FIG. 6.

The operation of the aforementioned switch 58 is best understood with reference to the diagrammatic representation in FIG. 7. In the drawing, there is illustrated a portion of the fascia 20 having a target area 76 within which a stimulus 78 is sensed. The stimulus 78 is via a touch input, such as an operator's finger. The instant invention is most suitably adapted for sensing a covered or gloved finger because of the three-dimensional separation between the electrodes 64, 68 (shown in FIG. 6). The sensitivity of the switch 58 may be adjustable by adjusting the external disturbance detected by the electrodes 64, 68. The switch 58 is not operated unless and until the stimulus 78 actually enters "into" the target area 76 and is in greater proximity to the first electrode 64 than the second electrode 68. In this way, the disturbance of the stimulus 78 must be detected by the first and second electrodes 64, 68 but, to a greater extent, by the first electrode 64 in order for the switch 58 to operate.

Figure 12:
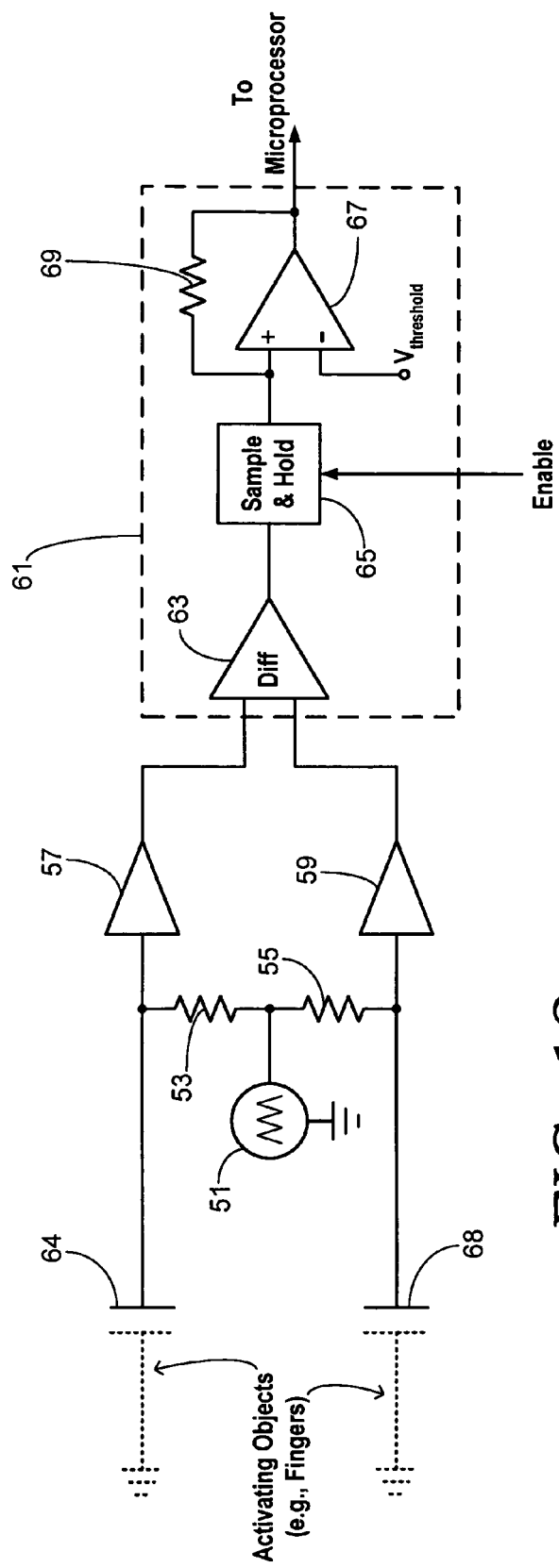
FIG. 12 is a schematic, block diagram showing detection circuitry of the present invention.

A detection circuit of the present invention is shown in FIG. 12. A power supply 51 supplies an alternating voltage to electrodes 64 and 68 through coupling resistors 53 and 55, respectively. The alternating voltage may comprise a 5 volt triangle-wave signal, for example. The sensing electrodes each exhibit a capacitance that varies according to whether an object (e.g., finger) is present nearby, such that the value of the capacitance is greater when an object is present. Each resistor 53 and 55 and the respective capacitances average or integrate the alternating voltage from supply 51, and the magnitude of the average or integrated voltage at the junctions of the resistors and capacitances are amplified by buffer amplifiers 57 and 59, respectively, which provides the buffered sensor signals to respective inputs of a difference amplifier 63 (preferably contained within an application specific integrated circuit, ASIC 61). A difference signal is generated in response to the difference in the magnitudes of the respective sensor signals. Preferably, the sensor signal from the inner electrode 64 is coupled by amplifier 57 to the noninverting input of difference amplifier 63 so that the difference signal has a relatively large positive magnitude when an object or finger is placed within the target area.

In a preferred embodiment, alternating power supply voltage is intermittently applied to resistors 53 and 55 under control of the microprocessor during a scanning process by which all the touch switches of a control panel are sequentially polled. During scanning, the output of power supply 51 may be sequentially applied to coupling resistors (not shown) of other touch switches via a multiplexer (not shown). When the touch switch comprising inner electrode 64 and outer electrode 68 is being driven by power supply 51, an enable signal is provided by the microprocessor to a sample and hold block 65. When the enable signal is active, sample and hold block 65 captures the current value of the difference signal from difference amplifier 63. The captured value of the difference signal is provided to the noninverting input of a comparator 67. In a non-scanning version of the invention with the alternating voltage signal being continuously active, the sample and hold block is unnecessary and the difference signal is connected directly from difference amplifier 63 to the noninverting input of comparator 67.

The inverting input of comparator 67 is coupled to a predetermined threshold voltage $V_{threshold}$. When the difference signal exceeds the threshold voltage, then comparator 67 produces a high-level logic signal which is coupled to the microprocessor to indicate that the finger or other object is present in the target area. Otherwise, comparator 67 produces a low-level logic signal to indicate no object is present.

A positive feedback circuit is employed to provide hysteresis in the switching of comparator 67. Hysteresis avoids the unstable oscillation of the comparator. The feedback circuit may comprise a resistor 69 coupled between the output of comparator 67 with the noninverting input of comparator 67. An active circuit could alternatively be used if a nonlinear hysteresis is desired.

Figure 8:
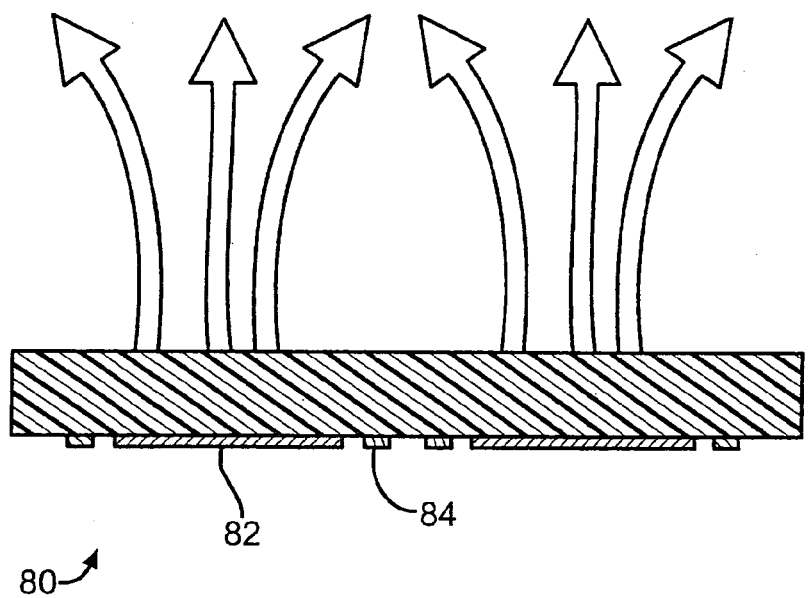
FIG. 8 is a diagrammatic representation in plan of another non-movable switch that is adapted for use with the motor vehicle interior trim component.

An alternative switch 80, similar to the switch 58 described above, is illustrated in FIG. 8. A switch suitable for this application is likewise described in the aforementioned U.S. Patent Application Publication. This switch 80 comprises a first electrode 82 and a second electrode 84 spaced from and surrounding the first electrode 82. Unlike the above-described switch 58, the electrodes 82, 84 of this switch 80 are oriented in the same plane. A signal is provided to the switch 80 to generate an electric field about the switch 80. Introduction of a stimulus, such as an operator's finger, near the switch 80 disturbs the electric field. A control circuit (not shown) detects disturbances in the electric field and generates a control signal in response. The control signal controls the operation of an electrically operated device of the motor vehicle.

Figure 9:
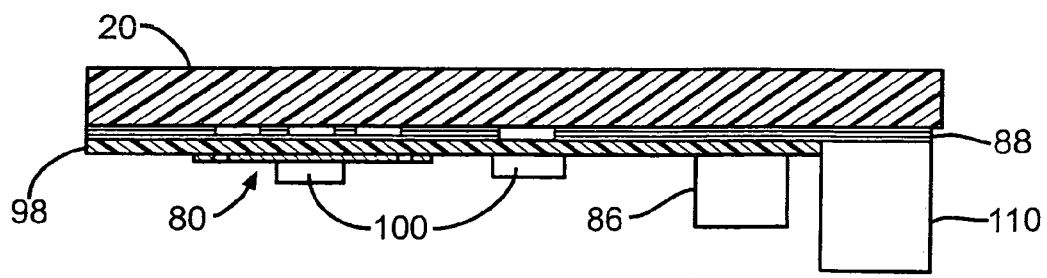
FIG. 9 is a partial cross-sectional view in plan of a motor vehicle interior trim component with the switch shown in FIG. 8 in combination with an audio driver assembly for providing audio and tactile sensations.

The interior trim component 10 according to the invention may have attached thereto an audio driver assembly 86, as shown in FIG. 9, for providing audible and/or tactile switch feedback. The fascia 20 of the interior trim component 10 may be in the form of an acrylic, polycarbonate or other lightweight, high-performance material and is ideally a tough, durable, shatter-resistant, and heat-resistant material. The fascia 20 may be a relatively dark transparent or translucent material, such as a flat smoked polycarbonate material. The fascia 20 may be flat, as shown, or may have tactile features, such as those described above. An applique 88, which may include a plurality of layers, may be disposed behind or adjacent an inner surface of the fascia 20 (i.e., below the fascia 20 when viewing FIG. 9). The applique 88 may, for example, have an outermost dark translucent or transparent layer, such as a black layer, which is disposed in the foreground. An intermediate layer may be provided behind or adjacent the outermost layer (i.e., below the outermost layer when viewing FIG. 9). The outermost layer may be etched and the intermediate layer may be translucent and an intermediate color, such as gray, which preferably contrasts well with the color of the outermost layer to provide a visual indication of the presence of the switch 80. In addition, the intermediate layer may be etched and an innermost layer may be provided adjacent the intermediate layer in the background, or opposite the outermost layer (i.e., below the intermediate layer when viewing FIG. 9). The innermost layer may be a lighter color, such as white, which contrasts well with the color of the intermediate layer. The intermediate layer may also be etched with a pattern representing a conventional or standard symbol. The lighter color of the innermost layer may be displayed through the etched intermediate layer. The layers may be paint layers, such as a black paint layer, a gray paint layer, and a diffused white paint layer.

Figure 10:
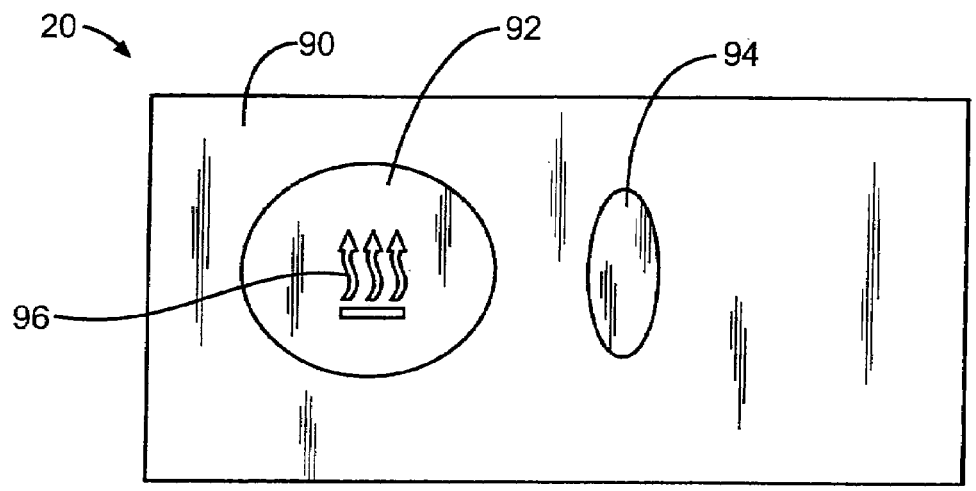
FIG. 10 is a front elevational view of the portion of the motor vehicle interior trim component shown in FIG. 9.

An example of a smoked polycarbonate fascia 20 with an applique 88 as described above is illustrated in FIG. 10. The fascia 20 is generally indicated at 20. The dark outermost layer is indicated at 90. The outermost layer 90 may be etched to reveal the intermediate layer to indicate the location of a switch at 92 and optionally reveal a visual indicator at 94. The intermediate layer may be similarly etched to reveal the innermost layer to provide a visual indication (i.e., such as the rear defogger symbol shown) of the switch function at 96 and the visual indicator of the switch condition at 94. It should be appreciated that a source of light 100, such as the LEDs shown in FIG. 9, may be located behind or in the background of the applique 88 for emitting light through the applique 88 and the fascia 20. This provides a visual indication of the location of a switch and the operable condition of the switch when the motor vehicle is operated in the dark.

In accordance with the present invention, the switch 80, the audio driver assembly 86, and the light source 100 may be supported by a flexible printed circuit board 98 that is located behind or adjacent the applique 88. The flexible printed circuit board 98 may conform tightly to the shape of the fascia 20, whether the fascia 20 is flat or has tactile features. Consequently, the audio driver assembly 86 may be located sufficiently close to the fascia 20 to produce a tactile sensation when operating the switch 80.

Figure 11:
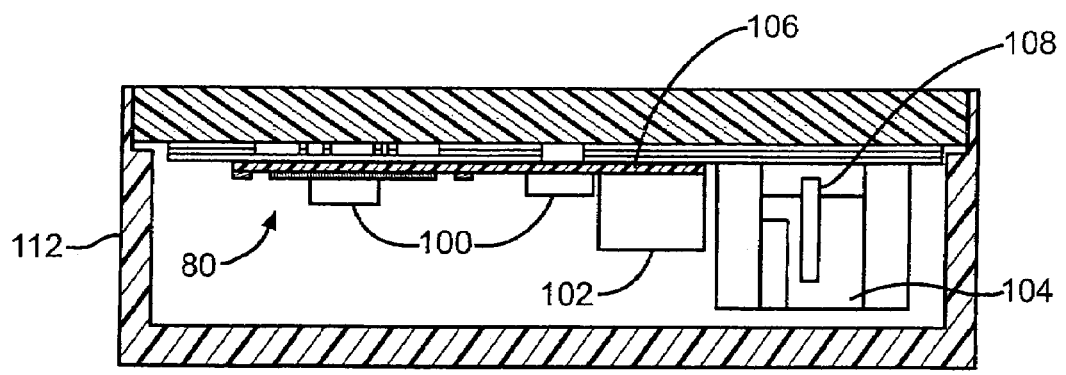
FIG. 11 is a partial cross-sectional view in plan of a motor vehicle interior trim component with the switch shown in FIG. 8 in combination with a tone generator and a tactile transducer for providing audible and tactile sensations.

It should be understood that a tone generator 102 and a tactile transducer 104, as shown in FIG. 11, may be used in addition to, or in the place of, the audio driver assembly 86 described above to produce audible and/or tactile switch feedback. The tone generator 102 and the tactile transducer 104, together with the switch 80 and a light source 100, may similarly be supported by a flexible printed circuit board 106. The tone generator 102 may function to produce audible sensations, such as soft soothing tones, to provide an audible sensation when the switch 80 is operated. The tactile transducer 104 may provide tactile sensations, such as clicking or thumping sensations, when the switch 80 is operated. The tactile transducer 104 may be in the form of a solenoid, which, when used in this application, may be referred to as a stamper or thumper. Upon operating the switch 80, the solenoid may be energized to displace a plunger, such as indicated at 108, which may tap, thump, vibrate, or otherwise cause a tactile sensation through the interior trim component 10.

It should be appreciated by one of ordinary skill in the art of the invention that various components of the invention may be programmable. For example, as stated above, the sensitivity of the switches 58 and 80 may be adjusted to accommodate the tactile features, or lack thereof, in the fascia 20. The intensity of the light source 100 may be programmed as desired. The frequency of the audio driver assembly 86 may be programmed to control the audible and tactile sensations produced therewith. For example, higher frequency signals could be produced by the audio driver assembly 86 to produce audible sensations while lower frequency signals could be produced by the audio driver assembly 86 to produce tactile sensations. Both high and low frequency signals can be produced to produce both audible and tactile sensations. These programmable features may be achieved by a controller, such as a microcontroller or processor, as indicated at 110 in FIG. 9 and instructions in memory accessed by the controller 110. The controller and suitable control circuitry may be supported by or otherwise connected to the printed circuit board 72, 98, 106 to control the operation of the switch 58, 80, the light source 100, the audio driver assembly 86, the tone generator 102, and the tactile transducer 104. The control circuitry may include individual latching switches for toggling individual light sources 100 and triggering the audio driver assembly 86, the tone generator 102, and the tactile transducer 104 to produce audible and tactile sensations when the switch 58, 80 is operated. Alternatively, the audio driver assembly 86, the tone generator 102, and the tactile transducer 104 may have an integral controller or control circuitry to control the operation thereof independently.

It should further be appreciated by one of ordinary skill in the art that the audio driver assembly 86, in addition to producing audible sensations, may also function as a center speaker for the motor vehicle.

In accordance with a preferred embodiment of the invention, the switches, the light sources 100, the audio driver assembly 86, the tone generator 102, and the tactile transducer 104 are contained within a box or housing 112 so as to be a self-contained unit. The entire housing 112 is preferably very small or thin and simple to remove from the interior trim component.

Through the use of mechanical or non-movable touch pads or switches, multiple parts and motion can be eliminated. The elimination of motion permits the elimination of gaps, which would otherwise be provided between the moving parts. Through the elimination of gaps, the appearance of the interior trim component 10 is improved, as is the cleanability of the interior trim component 10 and the environmental protection afforded by the interior trim component 10.

What is claimed is:

1. A touch pad control panel having an outer fascia, comprising:
    an outer sensing electrode forming a substantially peripheral boundary with respect to a target area of said outer fascia;
    an inner sensing electrode recessed from said outer sensing electrode and substantially axially aligned within said target area;
    a power supply applying an alternating voltage to said inner and outer sensing electrodes to generate inner and outer sensor signals having respective magnitudes that depend upon the presence of conductive objects approaching said outer fascia adjacent said target area;
    a difference block for generating a difference signal in response to said respective magnitudes; and
    a comparator for comparing said difference signal with a predetermined threshold and generating a switch activation signal in response to said comparison, wherein said predetermined threshold includes a hysteresis component.

2. The touch pad control panel of claim 1 wherein said alternating voltage is applied to said inner and outer sensing electrodes on an intermittent basis, and wherein said touch pad control panel further comprises a sample and hold block for capturing said difference signal when said alternating voltage is being applied.

3. The touch pad control panel of claim 1 wherein said hysteresis component is generated by a positive feedback circuit coupling an output of said comparator to an input of said comparator.

4. The touch pad control panel of claim 1 wherein said target area of said outer fascia is recessed within said outer sensing electrode to approach said inner sensing electrode.

5. A method of detecting a desired switch activation in a touch pad control panel having an outer fascia, said method comprising the steps of:
   providing an outer sensing electrode forming a substantially peripheral boundary with respect to a target area of said outer fascia;
   providing an inner sensing electrode recessed from said outer sensing electrode and substantially axially aligned within said target area;
   applying an alternating voltage to said inner and outer sensing electrodes to generate inner and outer sensor signals having respective magnitudes that depend upon the presence of conductive objects approaching said outer fascia adjacent said target area;
   generating a difference signal in response to said respective magnitudes;
   comparing said difference signal with a predetermined threshold, wherein said predetermined threshold includes a hysteresis component; and
   generating a switch activation signal in response to said comparison.

6. The method of claim 5 wherein said alternating voltage is applied to said inner and outer sensing electrodes on an intermittent basis.

7. The method of claim 6 further comprising the step of:
   capturing said difference signal when said alternating voltage is being applied.

8. The method of claim 5 wherein said hysteresis component is generated by positive feedback within said comparing step.

* * * * *